(12) United States Patent
Lee et al.

(10) Patent No.: US 7,697,362 B2
(45) Date of Patent: Apr. 13, 2010

(54) ARBITRATION FOR MEMORY DEVICE WITH COMMANDS

(75) Inventors: Young-Min Lee, Suwon-Si (KR);
Sung-Jae Byun, Yongin-Si (KR);
Han-Gu Sohn, Suwon-Si (KR);
Gyoo-Cheol Hwang, Seongham-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 592 days.

(21) Appl. No.: 11/521,655

(22) Filed: Sep. 15, 2006

(65) Prior Publication Data

US 2007/0070794 A1    Mar. 29, 2007

(30) Foreign Application Priority Data

Sep. 27, 2005    (KR) .................... 10-2005-0089798

(51) Int. Cl.
*G11C 8/00*    (2006.01)
(52) U.S. Cl. .................. 365/230.05; 365/149; 365/222; 711/149
(58) Field of Classification Search .................. 365/149, 365/203, 222, 228, 230.05, 233.14; 711/149
See application file for complete search history.

(56) References Cited

U.S. PATENT DOCUMENTS

| 4,967,398 | A | * | 10/1990 | Jamoua et al. | ......... 365/230.05 |
| 5,617,309 | A | | 4/1997 | Abert et al. | ................. 364/133 |
| 5,713,011 | A | * | 1/1998 | Satoh et al. | ................. 713/501 |
| 5,761,451 | A | | 6/1998 | Abert et al. | ................. 395/293 |
| 6,717,834 | B2 | * | 4/2004 | Zagorianakos et al. | ........ 365/63 |
| 6,862,667 | B2 | * | 3/2005 | Asakawa et al. | ............ 711/153 |
| 6,961,281 | B2 | * | 11/2005 | Wong et al. | ............ 365/230.03 |
| 7,047,371 | B2 | * | 5/2006 | Dortu | ......................... 711/154 |
| 7,600,065 | B2 | * | 10/2009 | Lee | ............................. 710/240 |
| 2004/0236887 | A1 | | 11/2004 | Kim et al. | |

* cited by examiner

*Primary Examiner*—Tuan T Nguyen
*Assistant Examiner*—Alexander Sofocleous
(74) *Attorney, Agent, or Firm*—Monica H. Choi

(57) ABSTRACT

A plurality of masters arbitrate for access to a shared memory device, such as a SDRAM (synchronous dynamic random access memory), amongst themselves using software and arbitration interfaces. The masters generate additional commands upon arbitration, such as MRS and PALL commands, for prevention of collision of commands, refresh starvation, and/or a missing pre-charge operation in the shared memory device.

19 Claims, 12 Drawing Sheets

ARBITRATION FOR MEMORY DEVICE WITH COMMANDS

CROSS-REFERENCE TO RELATED APPLICATION(S)

The present application claims priority under 35 U.S.C. §119 to Korean Patent Application No. 2005-89798, filed on Sep. 27, 2005, which is incorporated herein by reference in its entirety.

TECHNICAL FIELD

The present invention relates generally to arbitration for a shared memory device such as a SDRAM (synchronous dynamic random access memory), and more particularly, to using commands during software arbitration to prevent collision of commands, auto-refresh starvation, and/or a missing pre-charge operation.

BACKGROUND OF THE INVENTION

FIG. 1 shows a block diagram of an electronic system 100 having a plurality of masters sharing access to a memory device. Referring to FIG. 1, a plurality of masters including a first master 102, a second master 104, and a third master 106 share access to a multi-port memory device 108 which may be a multi-port SDRAM (synchronous dynamic random access memory). One of ordinary skill in the art is familiar with a SDRAM that operates synchronously with a clock signal from a master. In addition, a SDRAM is a command-based memory device with a master indicating a command by setting the logic states of a plurality of control signals.

The SDRAM 108 is deemed multi-port because the SDRAM 108 has a plurality of ports including a first port 112, a second port 114, and a third port 116. Each of the first, second, and third ports 112, 114, and 116 has a respective established signal interface SIF1, SIF2, or SIF3 for communication with a respective controller 122, 124, or 126 of the respective master 102, 104, or 106. Each of the signal interfaces SIF1, SIF2, and SIF3 is used for communication of control signals and data between the respective master 102, 104, or 106 and the SDRAM 108.

In addition, the first, second, and third masters 102, 104, and 106 have first, second, and third CPUs (central processing units), 132, 134, and 136, respectively. By running arbitration software, the CPUs 132, 134, and 136 arbitrate access to the shared SDRAM 108 among the masters 102, 104, and 106. The masters 152, 154, and 156 communicate such arbitration amongst them-selves via UART (universal asynchronous receiver/transmitter) interfaces 142 and 144. Generally, one of the masters 102, 104, and 106 is granted access for reading from or writing to the SDRAM 108 at a time.

FIG. 2 shows a timing diagram for arbitration between the first and second masters 102 and 104 for example. A first access indication signal SGM1 being set to the logical high state indicates that the first master 102 has access to the SDRAM 108, and the first master 102 is denied access when the first access indication signal SGM1 is set to the logical low state.

A second access indication signal SGM2 being set to the logical high state indicates that the second master 104 has access to the SDRAM 108, and the second master 104 is denied access when the second access indication signal SGM2 is set to the logical low state. In the example of FIG. 2, the first master 102 has access (i.e., has ownership) to the SDRAM 108 before time point T1, and the second master 104 has access to the SDRAM 108 after the time point T1.

Referring to FIG. 2, M1_CMD illustrates the commands generated by the first master 102, and M2_CMD illustrates the commands generated by the second master 104. In general, any command generated by a master is executed by the SDRAM 108 when that master has access. Otherwise, a command generated by a master not having access is not executed by the SDRAM 108. Thus in the example of FIG. 2, the SDRAM 108 performs the commands from the first master 102 before the time point T1 and from the second master 104 after the time point T1.

Thus, the SDRAM 108 executes active commands Active 1 and Active 12 each generated after a row cycle time $t_{RC}$ from periodic auto-refresh commands, as sent from the first master 102 before the time point T1. Each of the masters 102 and 104 periodically generates an auto-refresh command (as indicated by the lines labeled "Auto-Refresh" in FIG. 2).

Note that the first master 102 does not generate any active commands after time point T1 since the first master 102 is denied access. The first master 102 does generate the periodic auto-refresh commands after time point T1, but such auto-refresh commands are not executed by the SDRAM 108 after time point T1 (as indicated by the non-arrowed lines for the auto-refresh command after time point T1 in FIG. 2).

Further referring to FIG. 2, the SDRAM 108 executes active commands Active21 and Active22 each generated between the periodic auto-refresh commands, as sent from the second master 104 after the time point T1. In general, the row cycle time $t_{RC}$ is desired for the SDRAM 108 to execute the auto-refresh command before the SDRAM 108 may begin execution of an active command.

However in FIG. 2, a last auto-refresh command 152 from the first master 102 is being executed when the second master 104 sends the active command Active21 upon change of ownership at the time point T I. The active command Active21 is sent from the second master 104 before the end of the row cycle time $t_{RC}$ from the last auto-refresh command 152 resulting in "collision" of the Active21 command with the last auto-refresh command 152. As a result, the SDRAM 108 does not execute the Active21 command from the second master 104 upon change of ownership.

FIG. 3 shows another timing diagram of example signals SGM1, M1_CMD, SGM2, and M2_CM1 that results in "refresh starvation" in the SDRAM 108. The SGM1 and SGM2 signals in FIG. 3 illustrate frequent switching of ownership between the first and second masters 102 and 104. The first master 102 generates a series of active commands Active 11, Active 12, and Active 13 each between the periodic auto-refresh commands, and the second master 104 generates a series of active commands Active21, Active22, and Active23 each between the periodic auto-refresh commands.

However, only the active commands are generated within the times when the first and second masters 102 and 104 have access to the SDRAM 108. The auto-refresh commands are generated when the first and second masters 102 and 104 do not have access to the SDRAM 108. Thus, the SDRAM 108 only executes the active commands Active 11, Active21, Active 12, Active22, Active 13, and Active23, and does not execute any auto-refresh commands. The SDRAM 108 may operate improperly with such lack of execution of auto-refresh commands.

FIG. 4 shows another timing diagram of example signals SGM1, M1_CMD, SGM2, and M2_CMD that results in a "missing pre-charge" operation in the SDRAM 108. When the first master 102 has access with the SGM1 signal being set to the logical high state, the first master 102 issues a burstread operation to the SDRAM 108 with a RAS (row address strobe) command followed by eight read commands RD1, RD2, RD3, RD4, RD5, RD6, RD7, and RD8.

However, a first change of ownership occurs at time point T1 in FIG. 4 to the second master 104 which then performs a write operation with a RAS command followed by a write command WR1. Such a first change of ownership at the time point T1 occurs after the first master 102 has issued the first four read commands RD1, RD2, RD3, and RD4. A second change of ownership occurs at time point T2 in FIG. 4 back to the first master 102 which then issues the rest of the four read commands RD5, RD6, RD7, and RD8.

A pre-charge of bit-lines in the SDRAM 108 is desired before the WR1 command issued by the second master 104 between the time points T1 and T2 in FIG. 4. However, such a desired pre-charge operation is missing in FIG. 4 because of the abrupt change of ownership at time point T1.

Thus, such disadvantageous features of collision of commands as illustrated in FIG. 2, refresh starvation as illustrated in FIG. 3, and a missing pre-charge operation as illustrated in FIG. 4 are desired to be prevented during arbitration by software amongst the masters 102, 104, and 106 for the shared SDRAM 108.

SUMMARY OF THE INVENTION

Accordingly, in a general aspect of the present invention, additional predetermined commands are issued by each master upon gaining access or losing access to a shared memory device for preventing collision of commands, refresh starvation, and/or a missing pre-charge operation.

For arbitrating access to a memory device among a plurality of masters according to one embodiment of the present invention, a selected master receives an access indication that the selected master has access to the memory device. The selected master generates a predetermined setting command, such a MRS (mode register set) command, upon receiving the access indication and before generating an active command for preventing a collision between the active command and a prior command, such as an auto-refresh command, being executed by the memory device. Such generation of the MRS command provides a timing margin between the prior command and the active command.

For arbitrating access to a memory device among a plurality of masters according to another embodiment of the present invention, the memory device decides whether to perform an auto-refresh operation upon receiving the predetermined setting (such as the MRS) command. If the memory device has not performed an auto-refresh command within a predetermined time period, the memory device decides to perform the auto-refresh operation upon receiving the predetermined setting (such as the MRS) command, for preventing auto-refresh starvation.

For arbitrating access to a memory device among a plurality of masters according to another embodiment of the present invention, a prior master having access to the memory device generates a pre-charging command to be executed by the memory device before the selected master generates any command upon receiving the access indication. Thus, a missing pre-charge operation before generation of another active command by the selected master is avoided.

The present invention may be used to particular advantage when the memory device is a SDRAM (synchronous dynamic random access memory). However, the present invention may be practiced for other types of a command-based memory device shared amongst a plurality of masters.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, and 13 refer to elements having similar structure and/or function, unless stated other-wise.

DETAILED DESCRIPTION

Figure 5:
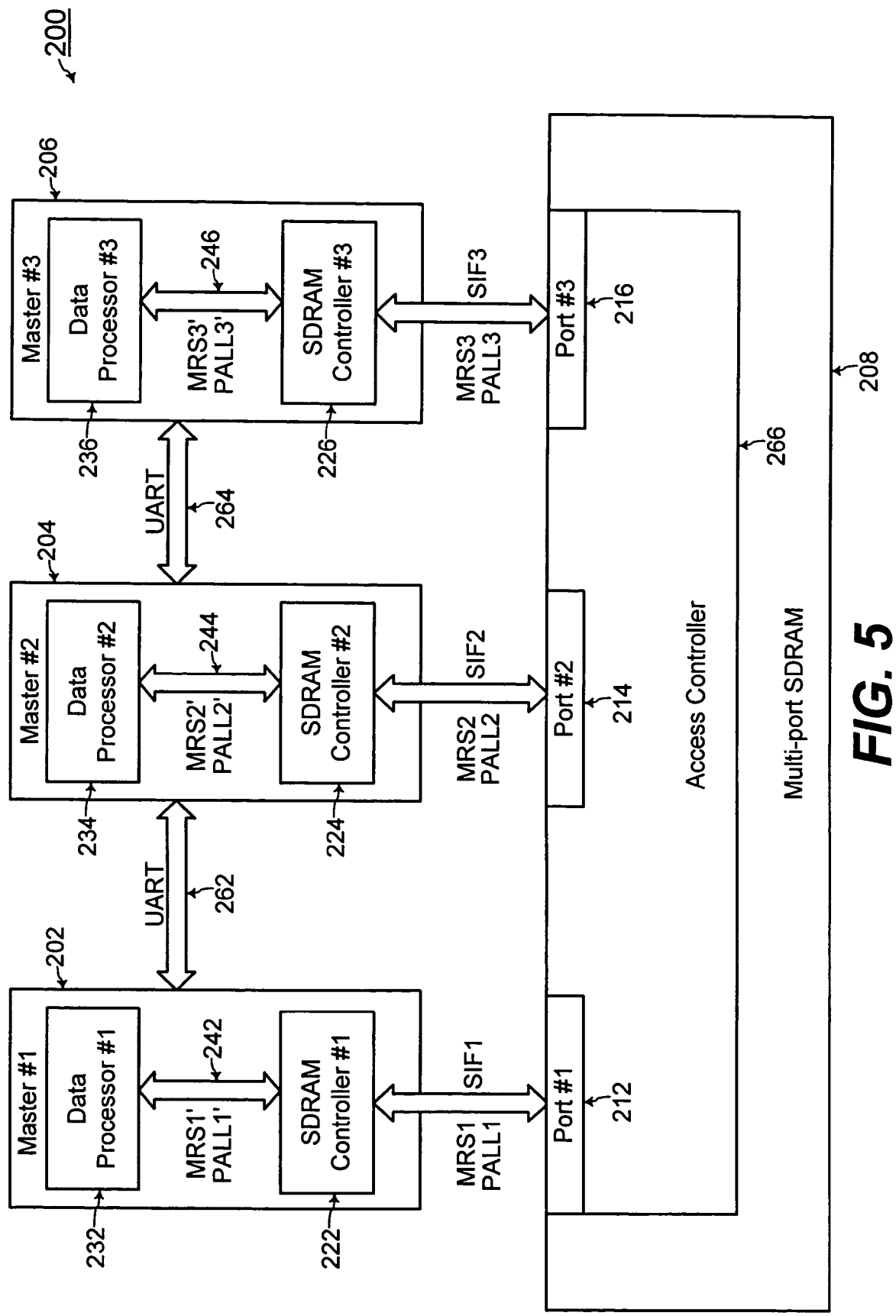
FIGS. 5 and 6 shows block diagrams of an electronic system with a plurality of masters sharing access to a multi-port memory device with software arbitration amongst the masters, according to an embodiment of the present invention.

FIG. 5 shows a block diagram of an electronic system 200 having a plurality of masters sharing access to a memory device with an arbitration scheme according to an embodiment of the present invention. Referring to FIG. 5, a plurality of masters including a first master 202, a second master 204, and a third master 206 share access to a multi-port memory device 208 which may be a multi-port SDRAM (synchronous dynamic random access memory).

One of ordinary skill in the art of memory devices is generally familiar with a SDRAM that operates synchronously with a clock signal from a master. In addition, a SDRAM in general is a command-based memory device with a master indicating a command by setting the logic states of a plurality of control signals.

The SDRAM 208 is deemed multi-port because the SDRAM 208 has a plurality of ports including a first port 212, a second port 214, and a third port 216. Each of the first, second, and third ports 212, 214, and 216 has a respective established signal interface SIF1, SIF2, or SIF3 for communication with a respective controller 222, 224, or 226 of the respective master 202, 204, or 206. Each of the signal interfaces SIF1, SIF2, and SIF3 is used for communication of control signals and data between the respective master 202, 204, or 206 and the SDRAM 208.

Figure 6:
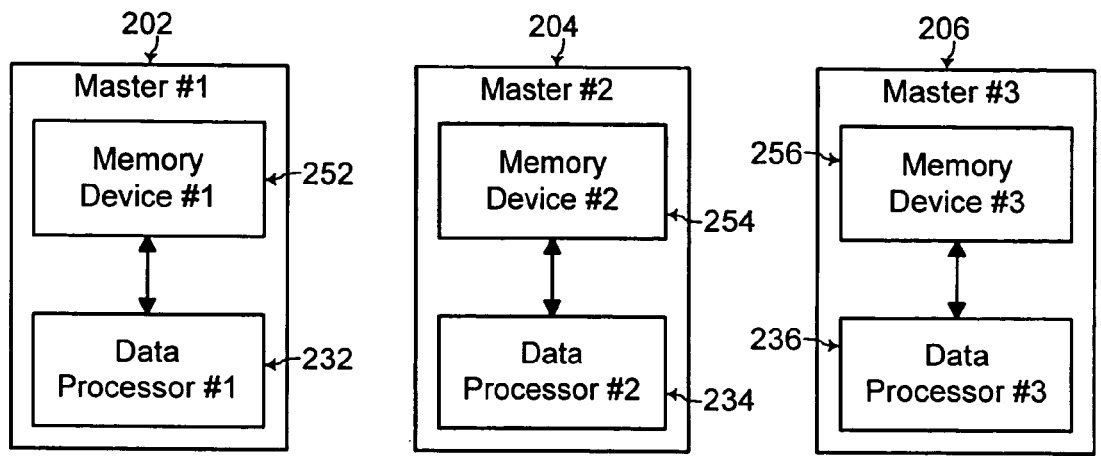

Each of the masters 202, 204, and 206 has a respective data processor 232, 234, or 236 that communicates with the respective controller 222, 224, or 226 via a respective internal bus 242, 244, or 246 when requesting for access to the shared SDRAM 208. Referring to FIGS. 5 and 6, each of the masters 202, 204, and 206 has a respective master memory device 252, 254, or 256 having sequences of instructions (i.e., software) stored thereon. Execution of the sequences of instructions by the respective data processor 232, 234, or 236 coupled to each of the memory devices 252, 254, or 256 causes the respective data processor 232, 234, or 236 to perform the operational steps described herein.

In particular referring to FIGS. 5 and 6, the data processors 232, 234, and 236 coordinate access to the shared SDRAM 208 amongst the masters 202, 204, and 206 by execution of the software stored on the memory devices 252, 254, and 256. The masters 202, 204, and 206 communicate amongst themselves via UART (universal asynchronous receiver/transmitter) interfaces 262 and 264 for arbitrating such access to the SDRAM 208.

Figure 7:
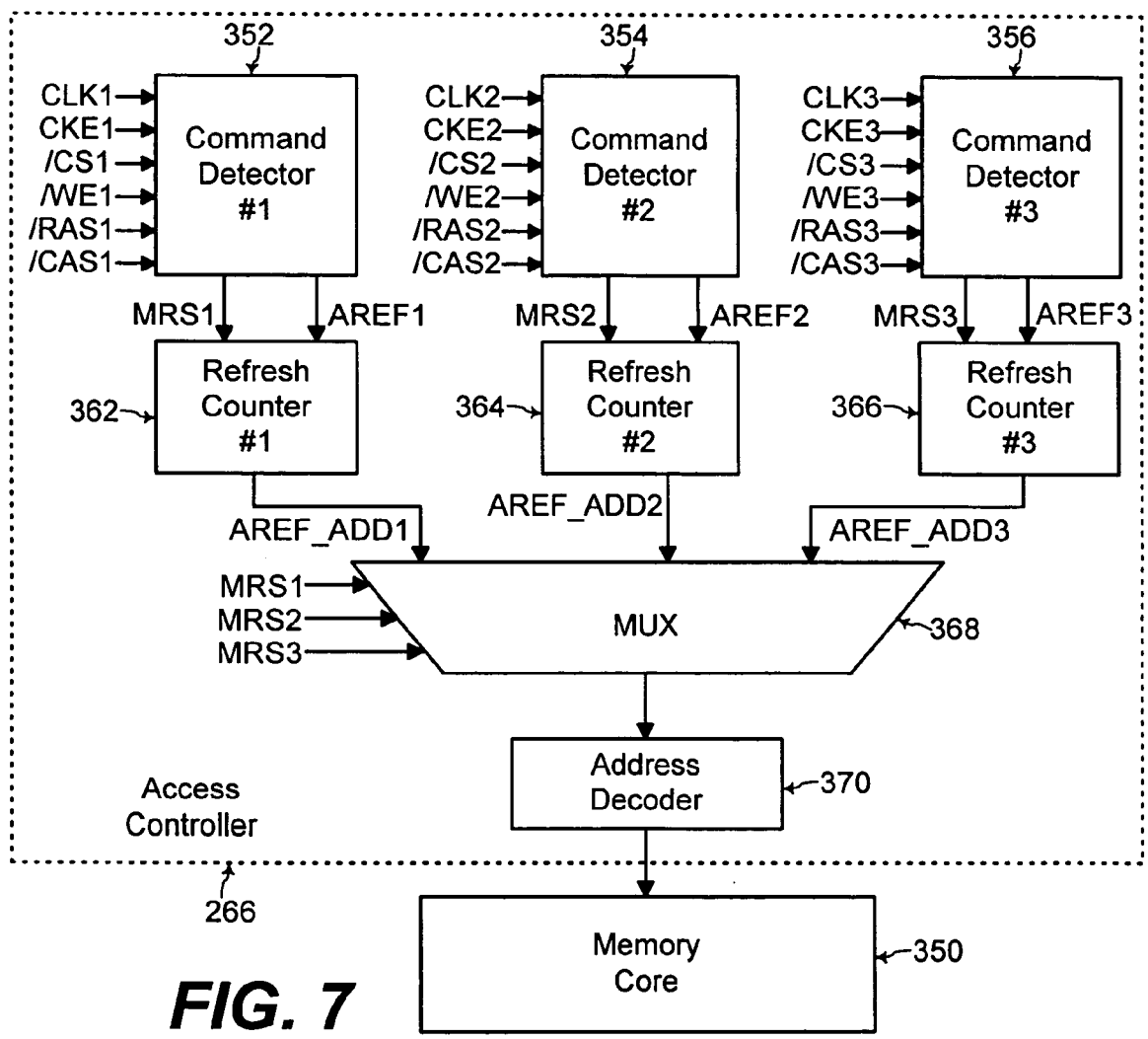
FIG. 7 shows a block diagram of an access controller in the electronic system of FIG. 5, according to an embodiment of the present invention.

The shared SDRAM 208 includes an access controller 266 fabricated as part of the multi-port SDRAM 208 in the embodiment of FIG. 5. The access controller 266 receives commands from the memory controllers 222, 224, and 226 via the interfaces SIF1, SIF2, and SIF3 and determines which command from one of the masters 202, 204, and 206 is to be executed by the SDRAM 208 depending on which of the masters 202, 204, and 206 has access. FIG. 7 shows a block diagram of the access controller 266 in FIG. 5 as will be described in more detail later herein.

Figure 8:
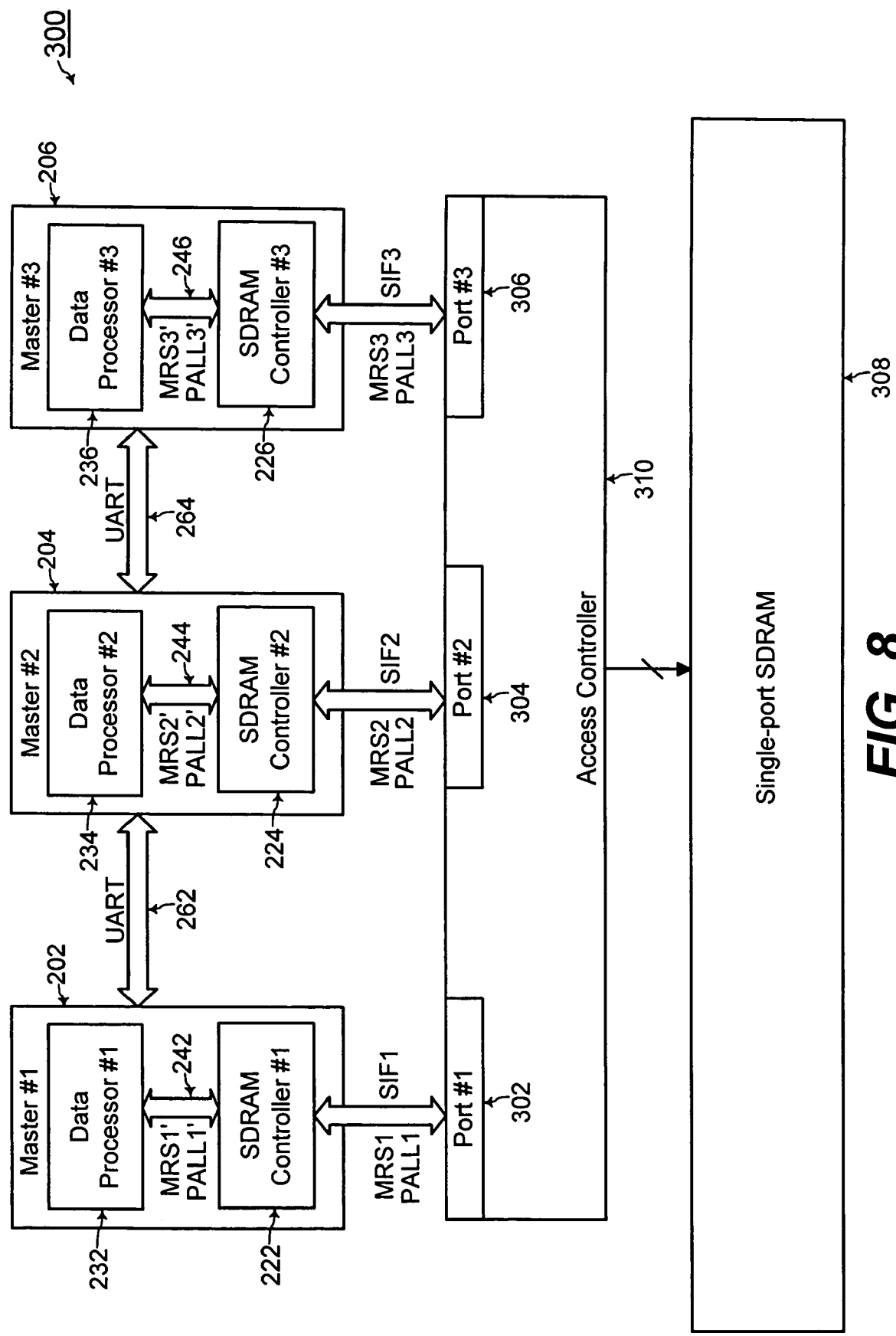
FIG. 8 shows a block diagram of an electronic system with a plurality of masters sharing access to a single-port memory device with software arbitration amongst the masters, according to another embodiment of the present invention.

FIG. 8 shows a block diagram of an electronic system 300 with a single-port SDRAM 308 that is shared among the masters 202, 204, and 206, according to an alternative embodiment of the present invention. Elements having the same reference number in FIGS. 5 and 8 refer to elements having similar structure and/or function. In FIG. 8, an access controller 310 is formed off-chip from the shared SDRAM 308.

Figure 9:
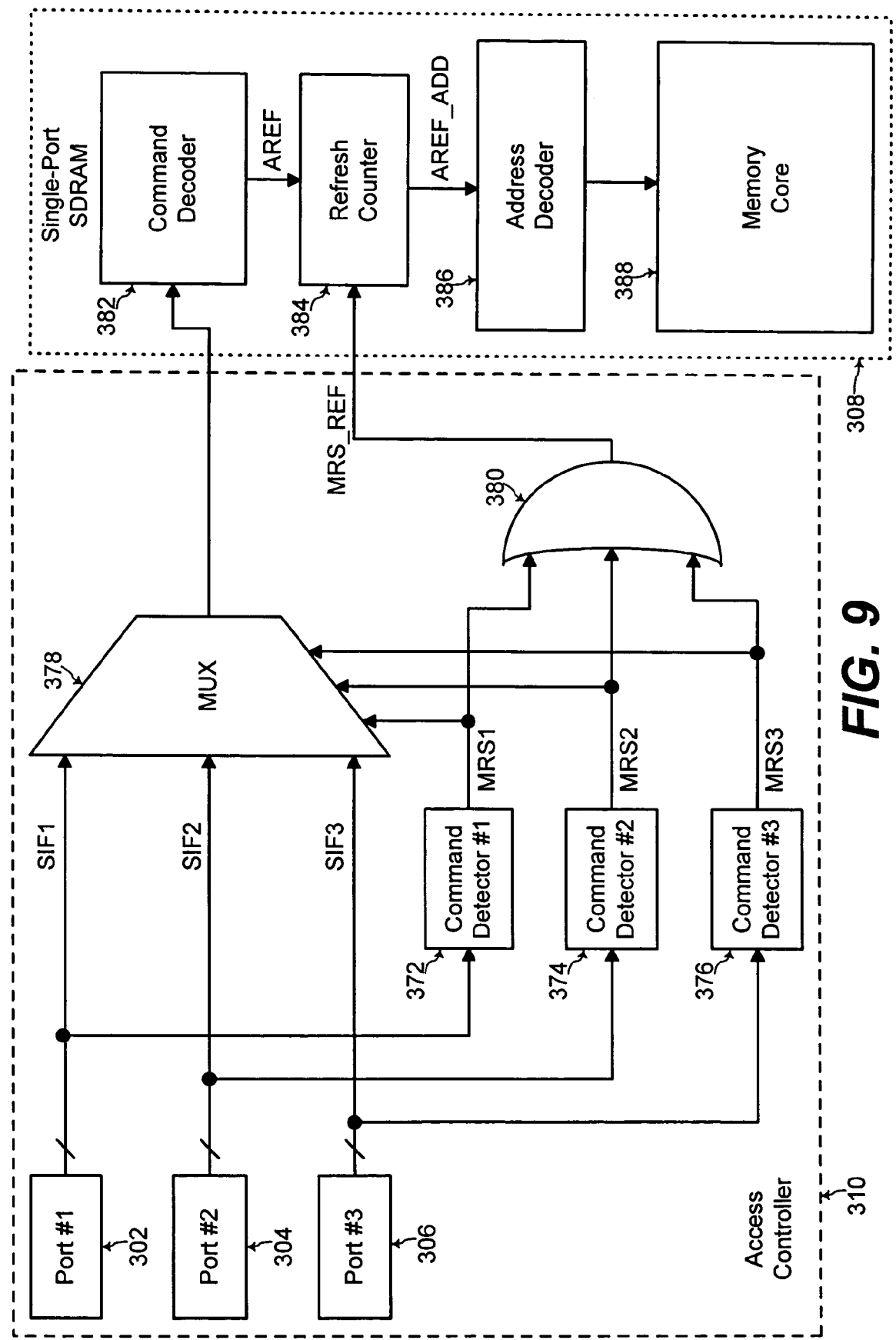
FIG. 9 shows a block diagram of an access controller in the electronic system of FIG. 8, according to another embodiment of the present invention.

Thus, the access controller 310 is formed with multiple ports 302, 304, and 306 for receiving control signals and data from the masters 202, 204, and 206, respectively, via the interfaces SIF1, SIF2, and SIF3, respectively. The access controller 310 receives commands from the memory controllers 222, 224, and 226 via the interfaces SIF1, SIF2, and SIF3 and determines which command from one of the masters 202, 204, and 206 is to be executed by the SDRAM 308 depending on which of the masters 202, 204, and 206 has access. FIG. 9 shows a block diagram of the access controller 310 in FIG. 8 as will be described in more detail later herein.

Figure 10:
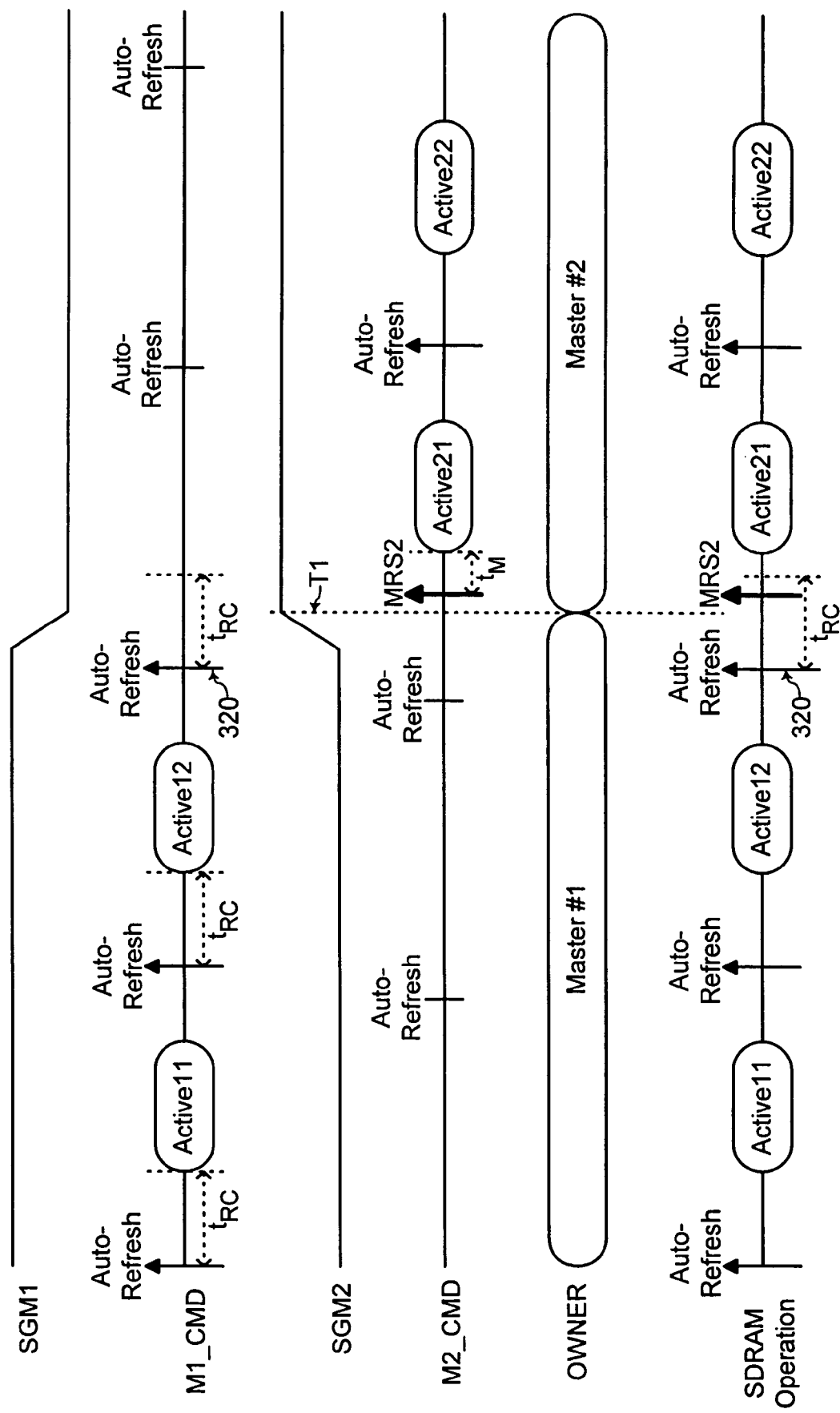
FIG. 10 shows a timing diagram of signals during operation of the electronic system of FIG. 5 or 8 for illustrating prevention of collision of commands, according to an embodiment of the present invention.

FIG. 10 shows a timing diagram of signals during operation of the electronic system 200 of FIG. 5 or 300 of FIG. 8 for preventing collision of commands, according to an embodiment of the present invention. Referring to FIGS. 5 and 10 for example, a first access indication signal SGM1 being set to the logical high state indicates that the first master 202 has access to the SDRAM 208, and the first master 202 is denied access when the first access indication signal SGM1 is set to the logical low state.

A second access indication signal SGM2 being set to the logical high state indicates that the second master 204 has access to the SDRAM 208, and the second master 204 is denied access when the second access indication signal SGM2 is set to the logical low state. In the example of FIG. 10, the first master 202 has access (i.e., has ownership) to the SDRAM 208 before time point T1, and the second master 204 has access to the SDRAM 208 after the time point T1.

Thus, each of the masters 202, 204, and 206 has a corresponding access indication signal that is communicated via the UART interfaces 262 and 264 for indicating a selected one of the masters having access to the SDRAM 208. Generally a selected one of the masters 202, 204, and 206 has access to the SDRAM 208 at a time.

Further referring to FIG. 10, M1_CMD illustrates the commands generated by the first master 202, and M2_CMD illustrates the commands generated by the second master 204. In general, any command generated by a master is executed by the SDRAM 208 when that master has access. Otherwise, a command generated by a master not having access is not executed by the SDRAM 208. Thus in the example of FIG. 10, the SDRAM 208 performs the commands from the first master 202 before the time point T1 and from the second master 204 after the time point T1.

Accordingly, the SDRAM 208 executes active commands Active11 and Active12 each generated after a row cycle time $t_{RC}$ from periodic auto-refresh commands, as sent from the first master 202 before the time point T1. Each of the masters 202 and 204 periodically generates an auto-refresh command (as indicated by the lines labeled "Auto-Refresh" in FIG. 10).

Note that the first master 202 does not generate any active commands after time point T1 since the first master 202 is denied access. The first master 202 still does generate the periodic auto-refresh commands after time point T1, but such auto-refresh commands from the first master 202 are not executed by the SDRAM 208 after time point T1 (as indicated by the non-arrowed lines for the auto-refresh command after time point T1 in FIG. 10).

Further referring to FIG. 10, the SDRAM 208 executes active commands Active21 and Active22 each generated between the periodic auto-refresh commands, as sent from the second master 204 after the time point T1. In general, the row cycle time $t_{RC}$ is desired for the SDRAM 208 to execute an auto-refresh command before the SDRAM 208 may begin execution of a subsequent active command.

Additionally in an aspect of the present invention, when a master acquires ownership of the SDRAM 208, the master generates a predetermined setting command such as a MRS (mode register set) command for preventing collision of commands. Thus, referring to FIGS. 5 and 10, when the second master 204 receives the access indication via the SGM2 signal for switch of ownership to the second master 204, its data processor 234 initiates a MRS (mode register set) command by generating a MRS2' control signal to its SDRAM controller 224 which in turn generates the MRS2 command.

Such a MRS2 command is generated before the first active command Active21 is generated by the second master 204 for providing a timing margin $t_M$ between such commands. Upon receiving the MRS2 command, the SDRAM 208 executes the MRS2 command before the Active21 command. A MRS command is generally used for setting a mode register within a SDRAM, and such a MRS command in general and individually is known to one of ordinary skill in the art of SDRAM design.

Further referring to FIG. 10, because the Active21 command is generated with a timing margin $t_M$ after the MRS2 command, the SDRAM executes the Active21 command well after the row cycle time $t_{RC}$ from executing the last auto-refresh command 320 received from the first master 202. Thus, the collision of the last auto-refresh command 320 from the first master 202 and the Active21 command from the second master 204 is prevented with generation of the MRS2 command.

Figure 11:
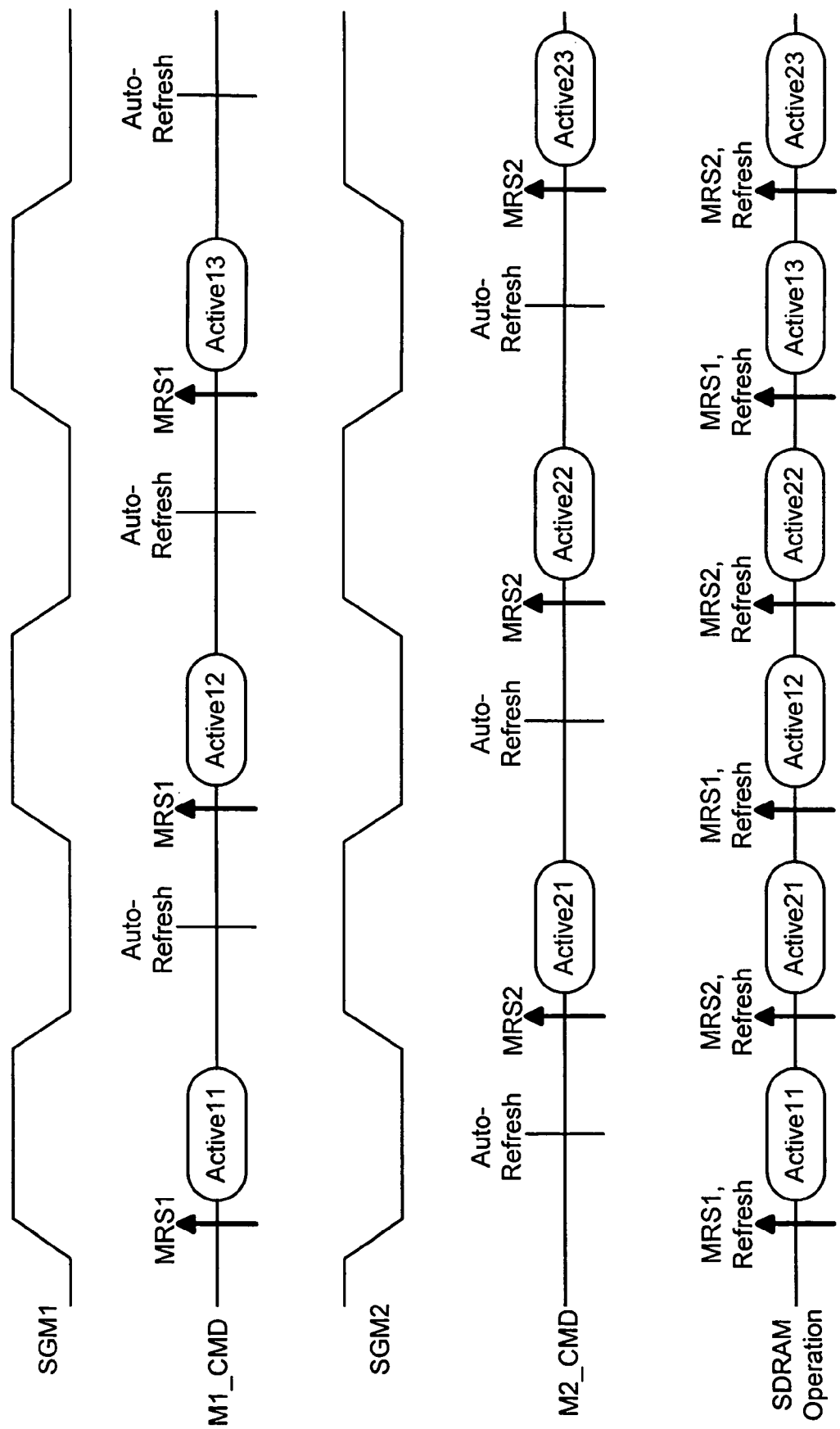
FIG. 11 shows a timing diagram of signals during operation of the electronic system of FIG. 5 or 8 for illustrating prevention of refresh starvation, according to an embodiment of the present invention.

FIG. 11 shows a timing diagram of signals during operation of the electronic system 200 of FIG. 5 or 300 of FIG. 8 for preventing refresh starvation, according to an embodiment of the present invention. Ownership is switched to the first master 202 upon each transition of the SGM1 signal to the logical high state. Upon such time point, the first data processor 232 initiates a MRS (mode register set) command by generating a control signal MRS1' for indicating to the memory controller 222 to generate a MRS1 (mode register set) command. Thus, the first master 202 generates a respective MRS1 signal upon each incidence of gaining ownership to the SDRAM 208, including before any of the active commands Active11, Active12, and Active13.

Similarly in FIG. 11, ownership is switched to the second master 204 upon each transition of the SGM2 signal to the logical high state. Upon such time point, the second master 204 generates a respective MRS2 (mode register set) signal, including before any of the active commands Active21, Active22, and Active23. The SDRAM 208 performs an auto-refresh operation in addition to the mode register set operation upon receiving any of the MRS1 and MRS2 commands such that refresh starvation is prevented.

In one embodiment of the present invention, the SDRAM 208 decides whether to perform the auto-refresh operation upon receiving any of the MRS1 and MRS2 commands. For example, if the SDRAM 208 is already performing an auto-refresh operation, the SDRAM 208 simply performs the mode register set operation without performing an additional auto-refresh operation upon receiving any of the MRS1 and MRS2 commands. If the SDRAM 208 has not already performed an auto-refresh operation within a predetermined time period, the SDRAM 208 performs an auto-refresh operation in addition to the mode register set operation upon receiving any of the MRS1 and MRS2 commands.

FIG. 7 shows an example block diagram of the SDRAM 208 of FIG. 5 including the access controller 266 and a memory core 350. The access controller 266 includes a first command detector 352, a second command detector 354, and a third command detector 356 coupled to a first refresh counter 362, a second refresh counter 364, and a third refresh counter 366, respectively.

Each of the command detectors 352, 354, and 356 inputs a respective set of clock and control signals from the respective interface SIF1, SIF2, or SIF2. Thus, the first command detector 352 receives a CLK1 (clock) signal, a CKE1 (clock enable) signal, a /CS1 (chip select) signal, a /WE1 (write enable) signal, a /RAS1 (row address strobe) signal, and a /CAS1 (column address strobe) signal from the first master 202 via the first interface SIF1. Such signals in general and individually are common and known to one of ordinary skill in the art of SDRAM design.

The second command detector 354 receives corresponding signals CLK2, CKE2, /CS2, /WE2, /RAS2, and /CAS2 from the second master 204 via the second interface SIF2. The third command detector 356 receives corresponding signals CLK3, CKE3, /CS3, /WE3, /RAS3, and /CAS3 from the third master 206 via the third interface SIF3.

Each command detector 352, 354, or 356 uses the respective set of such signals to determine whether the respective master sends a MRS command or an auto-refresh command. Upon receiving either of such commands, the command detector 352, 354, or 356 controls the corresponding refresh counter 362, 364, or 366 to increment a respective auto-refresh address AREF_ADD1, AREF_ADD2, or AREF_ADD3.

For example, the first command detector 352 activates a MRS1 signal when the first command detector 352 determines that the first master 202 sends a MRS command. Similarly, the first command detector 352 activates an AREF1 signal when the first command detector 352 determines that the first master 202 sends an auto-refresh command. The first refresh counter 362 increments the first auto-refresh address AREF_ADD1 when either of the MRS1 and AREF1 signals is activated.

The second command detector 354 activates a MRS2 signal when the second command detector 354 determines that the second master 204 sends a MRS command. Also, the second command detector 354 activates an AREF2 signal when the second command detector 354 determines that the second master 204 sends an auto-refresh command. The second refresh counter 364 increments the second auto-refresh address AREF_ADD2 when either of the MRS2 and AREF2 signals is activated.

The third command detector 356 activates a MRS3 signal when the third command detector 356 determines that the third master 206 sends a MRS command. Further, the third command detector 356 activates an AREF3 signal when the third command detector 356 determines that the third master 206 sends an auto-refresh command. The third refresh counter 366 increments the third auto-refresh address AREF_ADD3 when either of the MRS3 and AREF3 signals is activated.

The auto-refresh addresses AREF_ADD1, AREF_ADD2, and AREF_ADD3 are input to a multiplexer 368 that selects one of the auto-refresh addresses AREF_ADD1, AREF_ADD2, and AREF_ADD3 to be sent to an address decoder 370. The address decoder 370 decodes such a selected one of the auto-refresh addresses AREF_ADD1, AREF_ADD2, and AREF_ADD3 to refresh a row of the memory core 350 as indicated by the selected one of the auto-refresh addresses AREF_ADD1, AREF_ADD2, and AREF_ADD3.

The multiplexer 368 selects one of the auto-refresh addresses AREF_ADD1, AREF_ADD2, and AREF_ADD3 depending on which of the MRS1, MRS2, and MRS3 signals from the command decoders 352, 354, and 356, respectively, is activated to indicate ownership. If the MRS1 signal is activated, the multiplexer 368 selects the first auto-refresh address AREF_ADD1. If the MRS2 signal is activated, the multiplexer 368 selects the second auto-refresh address AREF_ADD2. If the MRS3 signal is activated, the multiplexer 368 selects the third auto-refresh address AREF_ADD3.

In one embodiment of the present invention, the SDRAM 208 performs an auto-refresh operation upon receiving an MRS command only if an auto-refresh operation has not been performed for a predetermined time period. In such an embodiment, each of the refresh counters 362, 364, and 366 includes a respective timer and increments its respective auto-refresh address only if the respective MRS signal is activated after its respective AREF signal was last activated at least the predetermined time period ago.

FIG. 9 shows a block diagram of the access controller 310 and the SDRAM 308 of FIG. 8. In FIG. 7, the access controller 266 is fabricated on-chip as part of the SDRAM 208 in FIG. 5. The access controller 310 of FIG. 9 may be formed off-chip apart from the SDRAM 308 that is a single-port memory device in FIG. 8.

Referring to FIG. 9, the access controller 310 includes a first command detector 372, a second command detector 374, and a third command detector 376. Each of the command detectors 372, 374, and 376 receives a respective set of clock and control signals from the masters 202, 204, and 206, respectively, similarly to the command detectors 352, 354, and 356 of FIG. 7.

Further referring to FIG. 9, the first command detector 372 activates a MRS1 signal if the first master 202 generates a MRS command. The second command detector 374 activates a MRS2 signal if the second master 204 generates a MRS command. The third command detector 376 activates a MRS3 signal if the third master 206 generates a MRS command.

The clock and control signals from the masters 202, 204, and 206 received at the ports 302, 304, and 306, respectively, via the interfaces SIF1, SIF2, and SIF3, respectively, are coupled to a multiplexer 378. The multiplexer 378 couples the respective clock and control signals from one of the masters 202, 204, and 206 depending on which one of the MRS1, MRS2, and MRS3 signals are activated to indicate ownership of the SDRAM 308.

If the MRS1 signal is activated, the first interface SIF1 of the first master 202 is coupled to a command decoder 382 of the SDRAM 308. If the MRS2 signal is activated, the second interface SIF2 of the second master 204 is coupled to the command decoder 382 of the SDRAM 308. If the MRS3 signal is activated, the third interface SIF3 of the third master 206 is coupled to the command decoder 382 of the SDRAM 308. Accordingly, the SDRAM 308 executes commands from one of the masters 202, 204, and 206 having ownership of the SDRAM 308.

The MRS1, MRS2, and MRS3 signals are also coupled to a logic unit 380 which is an OR gate in one embodiment of the present invention. If any of the MRS1, MRS2, and MRS3 signals are activated, the OR-gate 380 activates a MRS_REF signal sent to a refresh counter 384 of the SDRAM 308. The refresh counter 384 increments an auto-refresh address AREF_ADD when the MRS_REF signal is activated. In addition, the command decoder 382 generates an AREF signal that is activated when the command decoder determines that an auto-refresh command is sent by one of the masters 202, 204, and 206 having ownership. The refresh counter 384 also increments the auto-refresh address AREF_ADD when the AREF signal is activated.

In one embodiment of the present invention, the SDRAM 308 performs an auto-refresh operation upon any of the masters 202, 204, and 206 sending an MRS command only if an auto-refresh operation has not been performed for a predetermined time period. In such an embodiment, the refresh counter 384 includes a timer and increments the auto-refresh address AREF_ADD only if the MRS_REF signal is activated after the AREF signal was last activated at least the predetermined time period ago.

Figure 1:
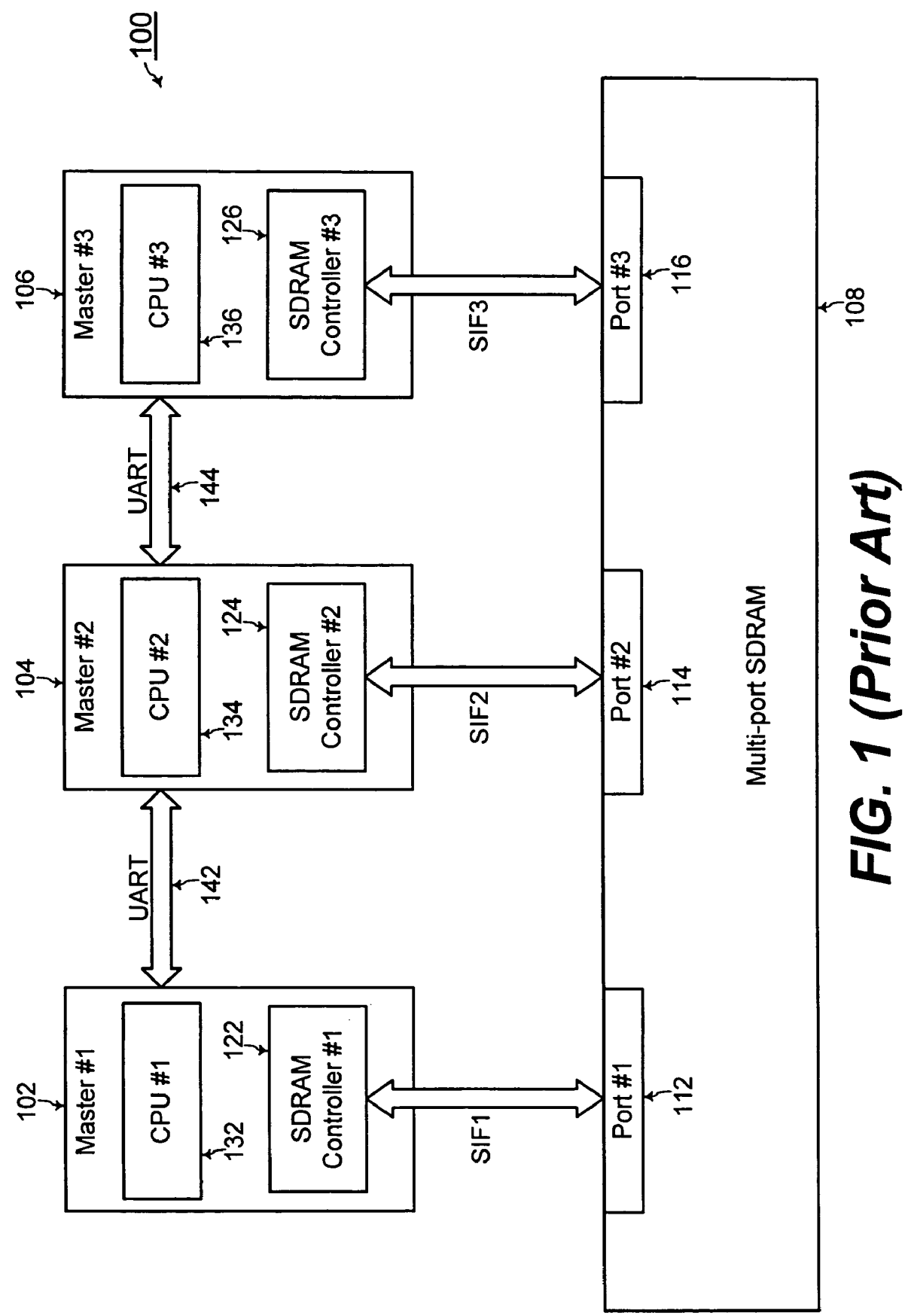
FIG. 1 shows a block-diagram of an electronic system with a plurality of masters sharing access to a memory device with software arbitration amongst the masters, according to the prior art.
Figure 2:
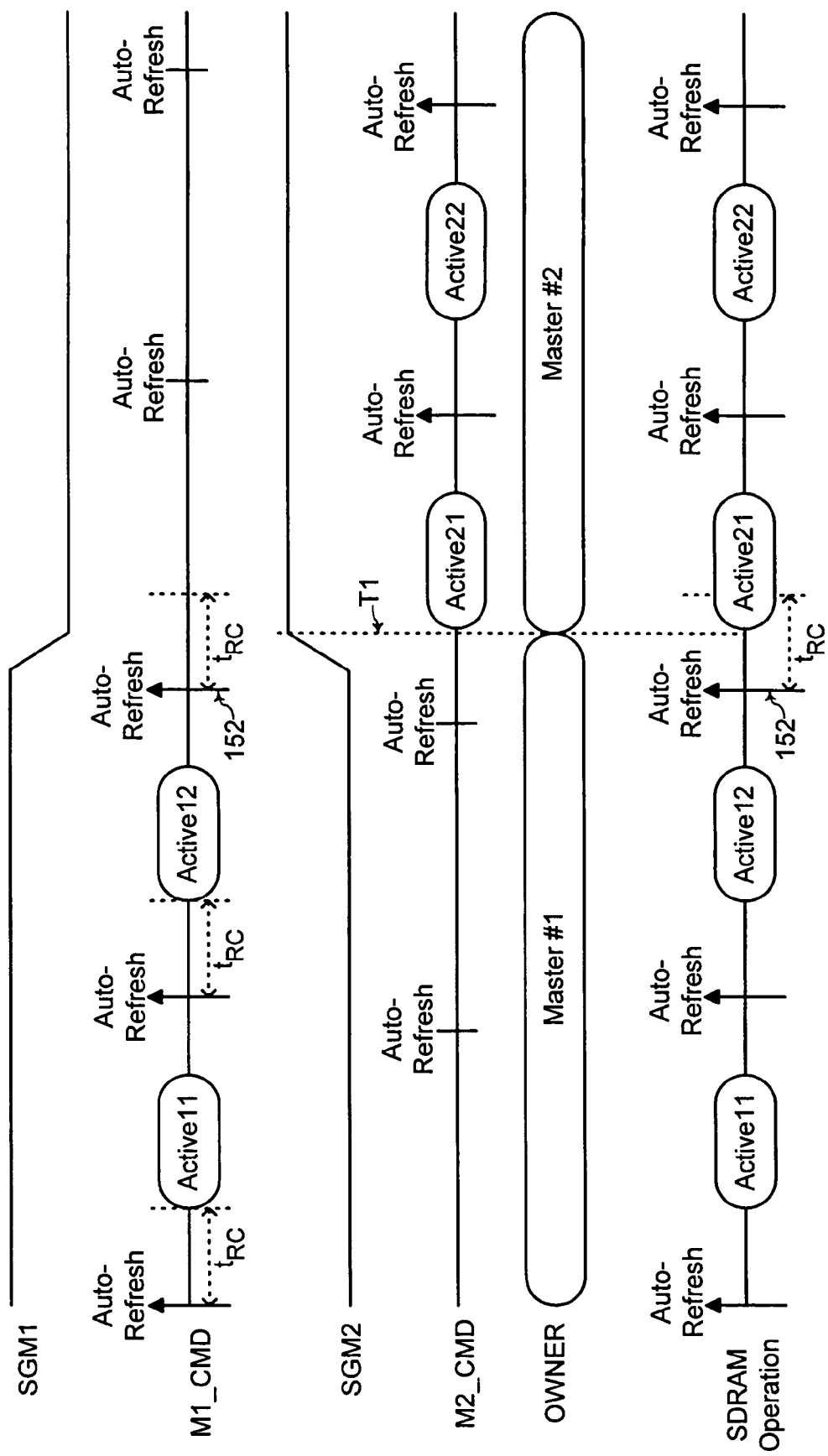
FIG. 2 shows a timing diagram of signals during operation of the electronic system of FIG. 1 for illustrating collision of commands as occurs in the prior art.
Figure 3:
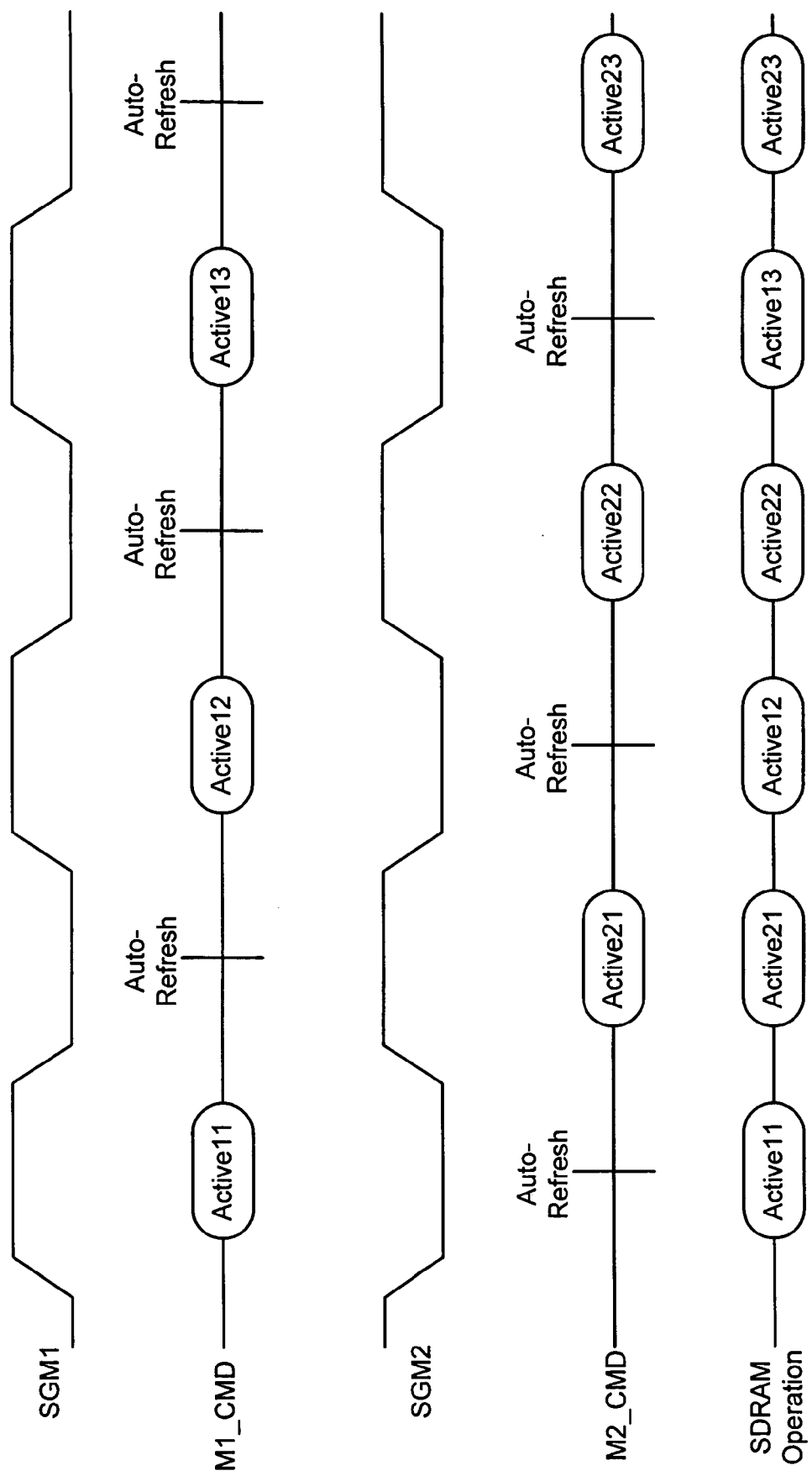
FIG. 3 shows a timing diagram of signals during operation of the electronic system of FIG. 1 for illustrating refresh starvation as occurs in the prior art.
Figure 4:
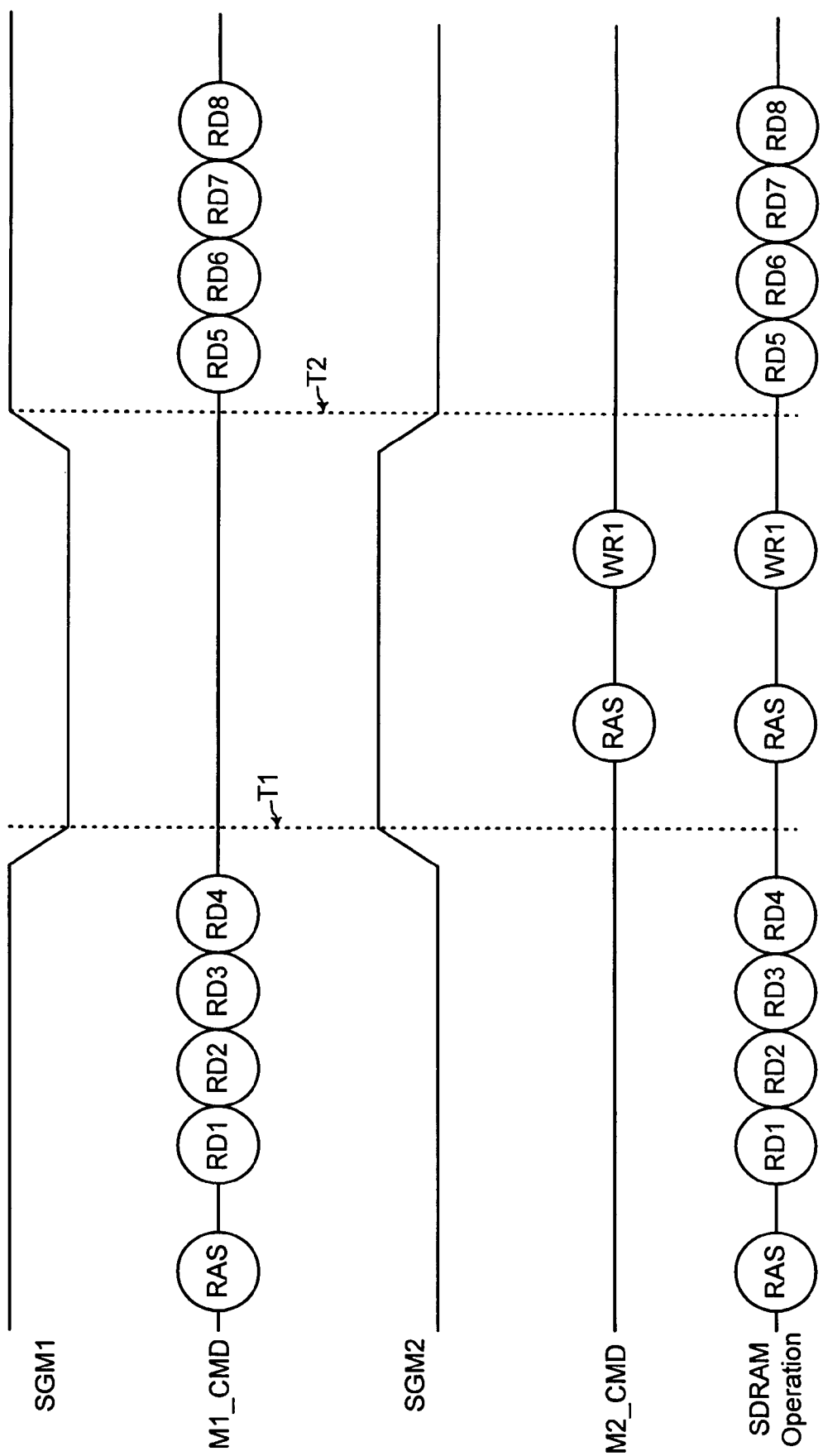
FIG. 4 shows a timing diagram of signals during operation of the electronic system of FIG. 1 for illustrating a missing pre-charge operation as occurs in the prior art.
Figure 12:
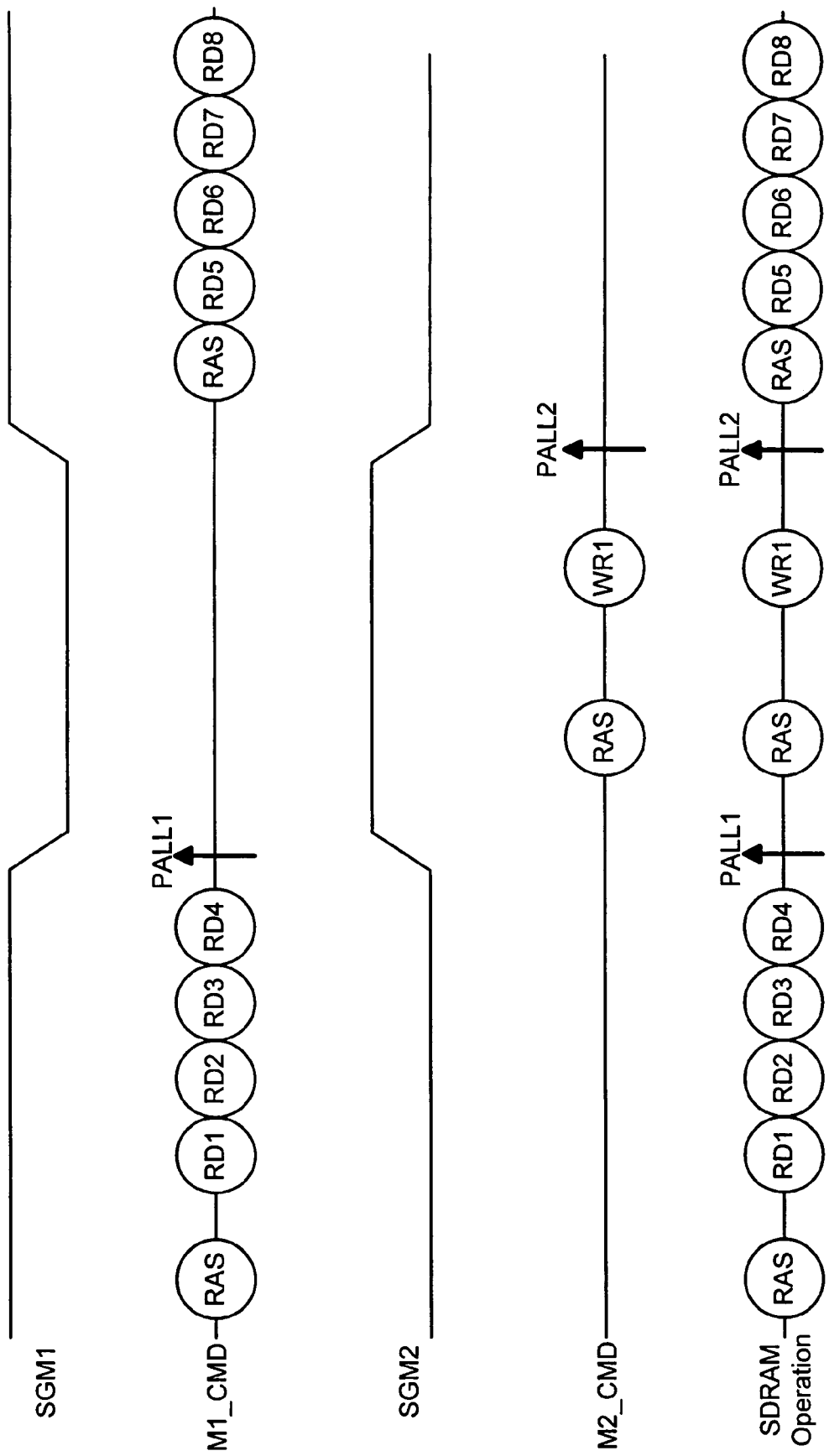
FIG. 12 shows a timing diagram of signals during operation of the electronic system of FIG. 5 or 8 for illustrating prevention of a missing pre-charge operation, according to an embodiment of the present invention.

FIG. 12 shows a timing diagram of signals during operation of the electronic system 200 of FIG. 5 or 300 of FIG. 8 for preventing a missing pre-charge operation, according to an embodiment of the present invention. FIG. 12 is similar to FIG. 4 as described herein, but FIG. 12 is different from FIG. 4 in that each of the masters 202, 204, and 206 generates a PALL (pre-charge all) command upon losing ownership of the shared SDRAM 208.

Thus referring to FIG. 12, the first master 202 generates a PALL1 command upon losing ownership after the RD4 command. Referring to FIGS. 5 and 12, the data processor 232 upon receiving the SGM1 signal that is deactivated to the logical low state initiates a PALL (pre-charge all) command by generating a control signal PALL1' to indicate that the SDRAM controller 222 is to generate the PALL1 command. Similarly referring to FIG. 12, the second master 204 generates a PALL2 command upon losing ownership after the WR1 command.

The SDRAM 208 performs a pre-charge all operation upon receiving each of the PALL1 and PALL2 commands. Bit-lines of all banks of the SDRAM 208 are pre-charged during a pre-charge all operation. A pre-charge all operation generally and individually is known to one of ordinary skill in the art of SDRAM design.

Thus, a pre-charge of the relevant bit-lines is not missing before the WR1 operation when the second master 204 has ownership. The present invention may also be practiced with the masters 202, 204, and 206 generating any other type of pre-charge command such as a PRE-SEL (pre-charge select) command upon losing ownership to the shared SDRAM 208. Bit-lines of a specified bank of the SDRAM 208 are pre-charged during a pre-charge select operation. A pre-charge select operation generally and individually is known to one of ordinary skill in the art of SDRAM design.

Figure 13:
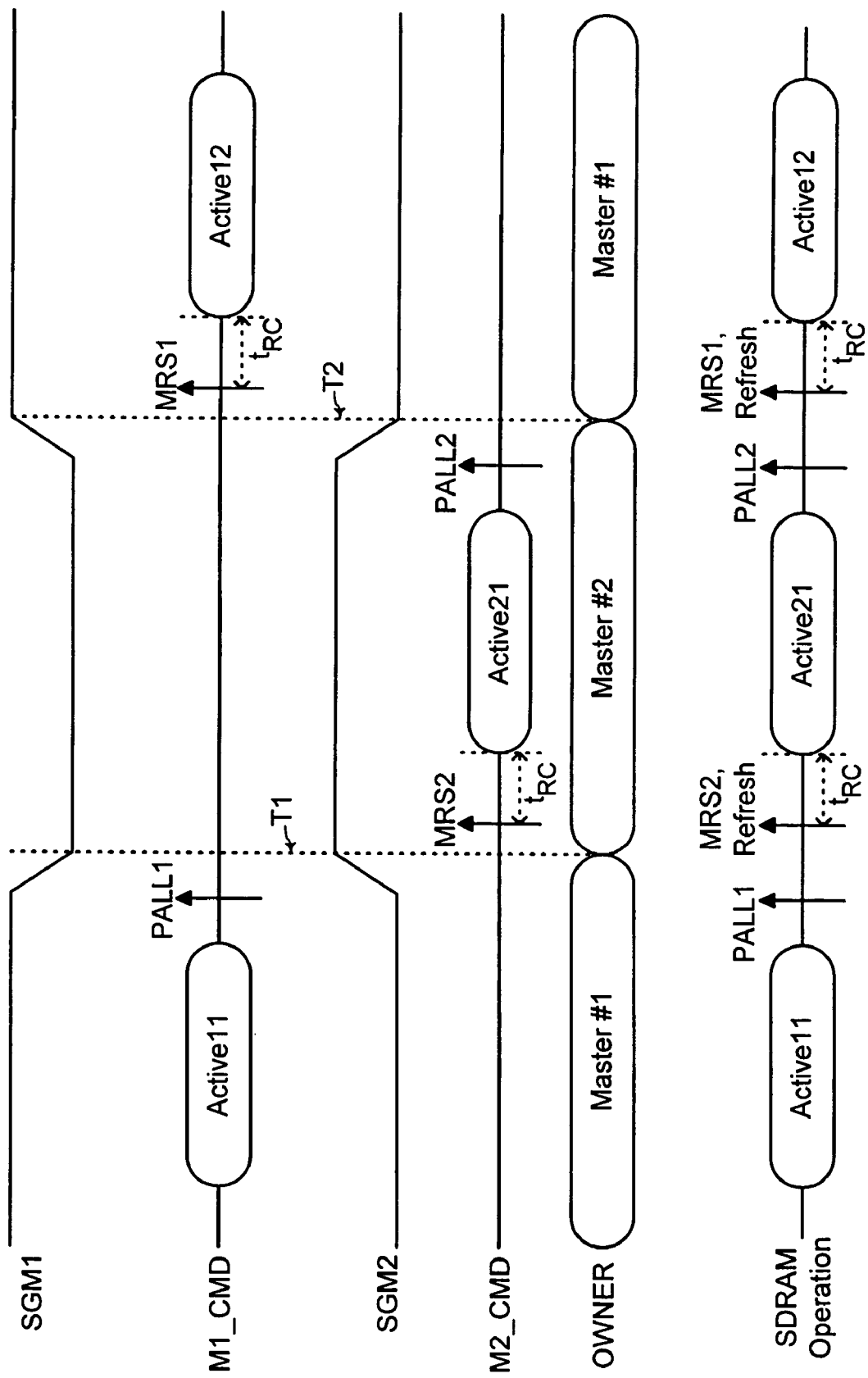
FIG. 13 shows a timing diagram of signals during operation of the electronic system of FIG. 5 or 8 for illustrating prevention of collision of commands, refresh starvation, and a missing pre-charge operation, according to an embodiment of the present invention.

FIG. 13 shows a timing diagram of signals during operation of the electronic system of FIG. 5 or 8 for illustrating prevention of collision of commands, refresh starvation, and a missing pre-charge operation, according to an embodiment of the present invention. Referring to FIG. 13, the first master 202 has ownership to the SDRAM 208 before the time point T1 and after the time point T2. The second master 204 has ownership to the SDRAM 208 between the time points T1 and T2.

The first master 202 generates a PALL1 (pre-charge all) command before losing ownership at time point T1. Upon gaining ownership at time point T2, the first master 202 also generates a MRS1 (mode register set) command with a timing margin of the row cycle time $t_{RC}$ before the active command Active 12.

Upon gaining ownership at time point T1, the second master 204 generates a MRS2 (mode register set) command with a timing margin of the row cycle time $t_{RC}$ before the active command Active21. The second master 204 generates a PALL2 (pre-charge all) command before losing ownership at time point T1.

The SDRAM 208 performs a pre-charge all operation upon receiving the PALL1 and PALL2 commands such that a pre-charge operation would not be missing upon change of ownership. The SDRAM 208 performs an auto-refresh operation upon receiving the MRS1 and MRS2 commands to prevent auto-refresh starvation in the SDRAM 208. In addition, the MRS1 and MRS2 commands are generated with the timing margin of the row cycle time $t_{RC}$ before the active commands Active12 and Active21, respectively, for preventing collision of the auto-refresh and active commands.

In this manner, in the embodiments of the present invention, the masters 202, 204, and 206 generate additional commands, such as MRS and PALL commands, upon software arbitration amongst themselves. Such additional commands are advantageously used for prevention of collision of commands, refresh starvation, and/or a missing pre-charge operation in the shared SDRAM 208.

The foregoing is by way of example only and is not intended to be limiting. Thus, any number of elements as illustrated and described herein is by way of example only. In addition, the present invention has been described for the shared SDRAM 208 in the electronic system 200 of FIG. 5, but the present invention may be similarly applied to the electronic system 300 of FIG. 8 as would be apparent to one of ordinary skill in the art from the description herein.

Furthermore, the present invention has been described and illustrated in the timing diagrams of FIGS. 10, 11, 12, and 13 for arbitration for access between the first and second masters 202 and 204. However, the present invention may be similarly applied for arbitration for access among any number of masters including the third master 206. Additionally, the present invention has been described for the shared SDRAM. However, the present invention may also be practiced for other types of shard memory devices.

The present invention is limited only as defined in the following claims and equivalents thereof.

The invention claimed is:

1. A method of arbitrating access to a memory device among a plurality of masters, comprising:
   receiving, by a selected master, an access indication that the selected master has access to the memory device; and
   generating, by the selected master, a predetermined setting command upon receiving the access indication and before generating an active command for preventing a collision between the active command and an auto-fresh command being executed by the memory device.

2. The method of claim 1, further comprising:
   executing, by the memory device, the predetermined setting command before executing the active command for generating a timing margin between the auto-fresh command and the active command.

3. The method of claim 2, wherein the predetermined setting command is initiated by a data processor of the selected master.

4. The method of claim 1, wherein the auto-fresh command has been issued by a prior master having access to the memory device before the access indication is received by the selected master.

5. The method of claim 4, wherein the auto-fresh command is issued by the prior master.

6. The method of claim 4, further comprising:
   generating, by the prior master, a pre-charging command to be executed by the memory device before the selected master generates any command upon receiving the access indication.

7. The method of claim 6, wherein the memory device performs an auto-refresh operation upon receiving the predetermined setting command when the auto-fresh command is not for an auto-refresh operation that has been performed within a predetermined time period.

8. The method of claim 1, wherein the predetermined setting command is a MRS (mode register set) command.

9. The method of claim 1, wherein the memory device is a SDRAM (synchronous dynamic random access memory).

10. The method of claim 1, further comprising:
    using, by an access controller, the predetermined setting command for selecting a respective interface of the selected master to be coupled to a memory core of the memory device while uncoupling a respective interface of any other master from the memory core.

11. The method of claim 10, further comprising:
    forming the access controller as part of the memory device.

12. The method of claim 10, further comprising:
    forming the access controller outside of the memory device.

13. A master that arbitrates for access to a shared memory device among a plurality of masters, comprising:
    a data processor; and
    a master memory device having a sequence of instructions stored therein, and wherein execution of the sequence of instructions by the data processor causes the data processor to perform the steps of:
    generating a predetermined setting command upon receiving an access indication and before generating an active command; and
    sending the predetermined setting command to the shared memory device that performs the predetermined setting command for preventing a collision between the active command and an auto-refresh command being executed by the shared memory device.

14. The master of claim 13, wherein the shared memory device executes the predetermined setting command before executing the active command for generating a timing margin between the auto-fresh command and the active command.

15. The master of claim 13, wherein the predetermined setting command is a MRS (mode register set) command.

16. The master of claim 13, wherein the shared memory device is a SDRAM (synchronous dynamic random access memory).

17. The master of claim 13, further comprising:
    an interface that is coupled to a memory core of the shared memory device by an access controller when the predetermined setting command is generated by the master.

18. The master of claim 17, wherein the access controller is formed as part of the shared memory device.

19. The master of claim 17, wherein the access controller is formed outside of the shared memory device.

\* \* \* \* \*